United States Patent
Kousokabe

(10) Patent No.: US 10,649,830 B2
(45) Date of Patent: May 12, 2020

(54) INSPECTION SYSTEM, INSPECTION DEVICE, AND INSPECTION METHOD

(71) Applicant: RENESAS ELECTRONICS CORPORATION, Tokyo (JP)

(72) Inventor: Seiichi Kousokabe, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 180 days.

(21) Appl. No.: 15/899,825

(22) Filed: Feb. 20, 2018

(65) Prior Publication Data

US 2018/0300192 A1    Oct. 18, 2018

(30) Foreign Application Priority Data

Apr. 14, 2017 (JP) ................ 2017-080698

(51) Int. Cl.
| G06F 11/00 | (2006.01) |
| G06F 11/07 | (2006.01) |
| G06F 11/30 | (2006.01) |
| G01R 31/3177 | (2006.01) |
| G06F 11/34 | (2006.01) |
| G06F 11/27 | (2006.01) |

(52) U.S. Cl.
CPC ........ G06F 11/076 (2013.01); G01R 31/3177 (2013.01); G06F 11/27 (2013.01); G06F 11/3024 (2013.01); G06F 11/3409 (2013.01); *G06F 2201/88* (2013.01)

(58) Field of Classification Search
CPC .............. G06F 11/076; G06F 11/3024; G06F 11/3409; G01R 31/3177
See application file for complete search history.

(56) References Cited

U.S. PATENT DOCUMENTS

| 4,541,048 A * | 9/1985 | Propster .............. G06F 15/8015 |
| | | 708/524 |
| 2005/0110806 A1* | 5/2005 | Stobie ................. G06F 11/3688 |
| | | 345/690 |
| 2008/0016404 A1* | 1/2008 | Ishikawa ............ G05B 23/0229 |
| | | 714/43 |

(Continued)

FOREIGN PATENT DOCUMENTS

JP    2007-293524 A    11/2007

*Primary Examiner* — Joshua P Lottich

(74) *Attorney, Agent, or Firm* — McDermott Will & Emery LLP

(57) ABSTRACT

It is determined whether an arithmetic operation function of a device to be inspected is normal or not. A MCU 13 to be inspected acquires a constant to be used for an arithmetic problem from a power source IC 12 on an inspection side. The MCU 13 sequentially selects a plurality of the arithmetic problems and carries out an arithmetic operation using the acquired constant according to the selected arithmetic problem. A monitoring circuit 23 of the power source IC 12 receives the result of the arithmetic operation of the arithmetic problem from the MCU 13. The monitoring circuit 23 compares the received arithmetic operation result with the arithmetic operation result of the arithmetic problem calculated at the side of the monitoring circuit 23. The monitoring circuit 23 determines whether the arithmetic operation function of the MCU 13 works normally or not based on the comparison result.

14 Claims, 11 Drawing Sheets

(56) References Cited

U.S. PATENT DOCUMENTS

| | | | |
|---|---|---|---|
| 2012/0191286 A1* | 7/2012 | Bouwman | B62D 1/28 |
| | | | 701/25 |
| 2015/0192640 A1* | 7/2015 | Lin | G01R 31/31703 |
| | | | 714/735 |
| 2016/0124826 A1* | 5/2016 | Sugahara | G06F 11/27 |
| | | | 714/30 |

* cited by examiner

| NUMBER | ARITHMETIC PROBLEM |
|---|---|
| 0 | m * n |
| 1 | m + n |
| 2 | m − n |
| 3 | m / n |
| 4 | m * m |
| 5 | m >> 1 |
| 6 | m << 1 |
| 7 | n / m |

| PROCESS | NUMBER OF ARITHMETIC PROBLEM TO BE SELECTED |
|---------|---------------------------------------------|
| A | 0, 1, 3 |
| B | 1, 2, 4, 5 |
| ... | ... |

Fig. 9

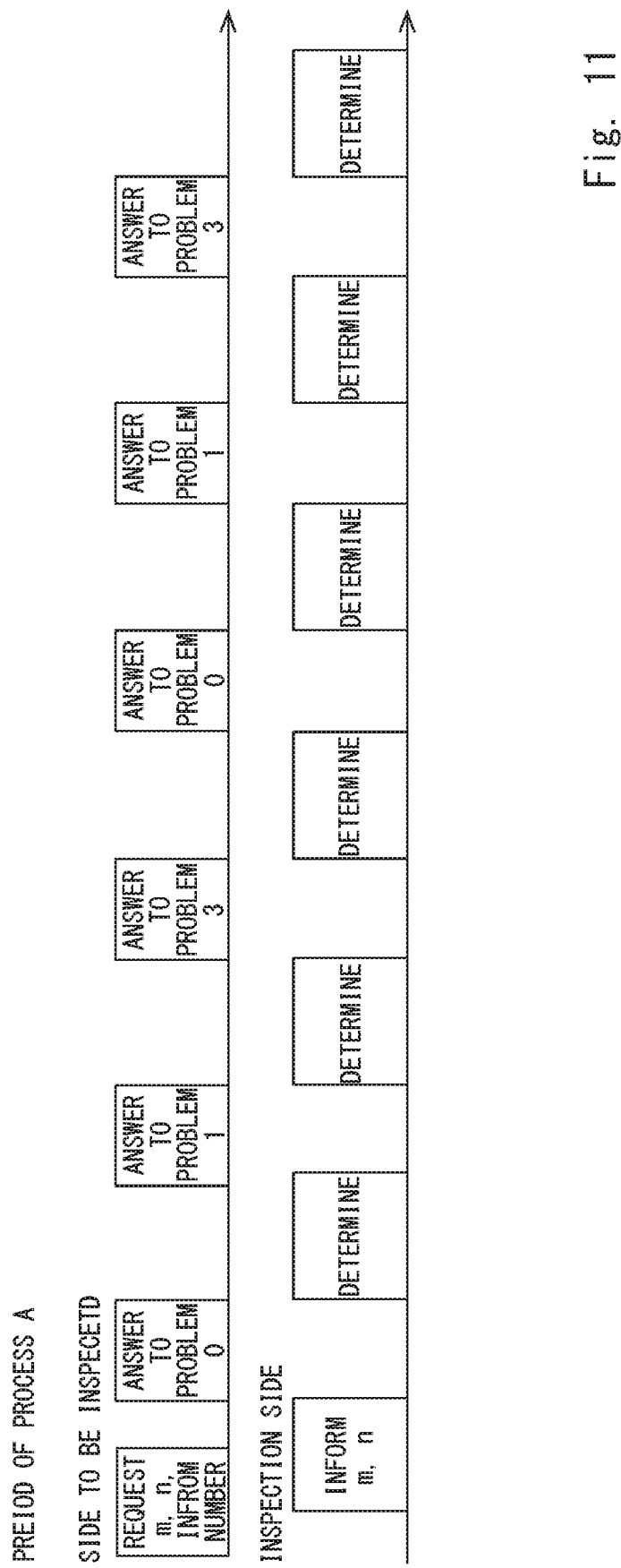

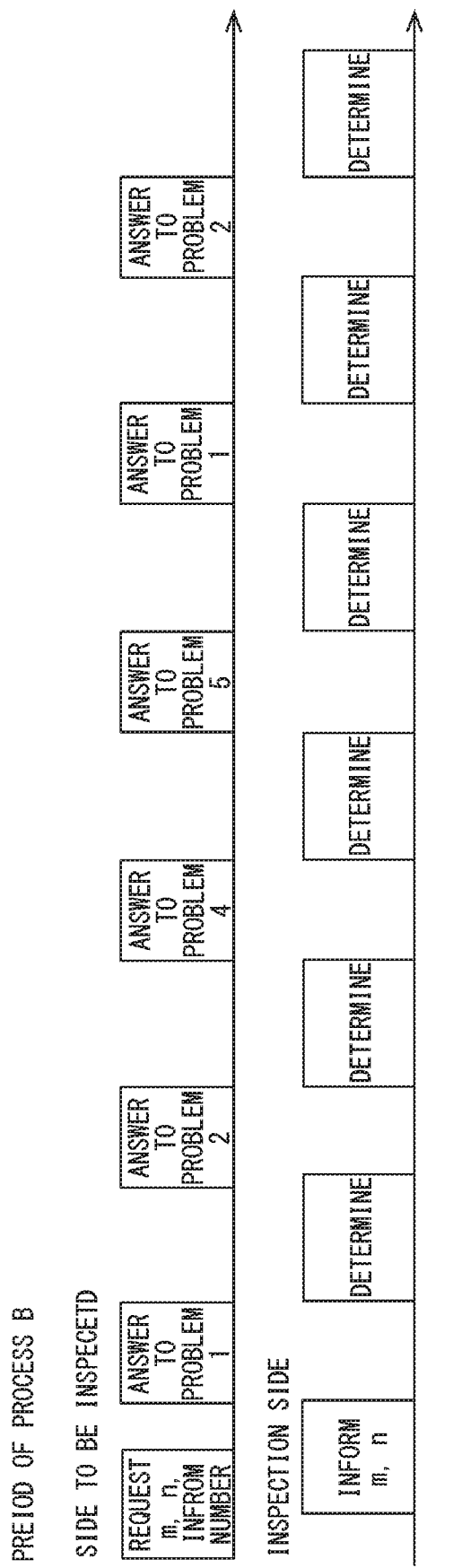

INSPECTION SYSTEM, INSPECTION DEVICE, AND INSPECTION METHOD

CROSS-REFERENCE TO RELATED APPLICATIONS

This application is based upon and claims the benefit of priority from Japanese patent application No. 2017-080698, filed on Apr. 14, 2017, the disclosure of which is incorporated herein in its entirety by reference.

BACKGROUND

The present disclosure relates to an inspection system, an inspection device, and an inspection method, for example relates to an inspection system, an inspection device, and an inspection method for inspecting a device to be inspected including an arithmetic operation unit.

A watch dog timer (WDT) is known as a mechanism for determining whether a function of a CPU (Central Processing Unit) or the like provided in a device is normal or not. In general, the watch dog timer periodically receives pulse signals from a CPU. When the watch dog timer cannot receive the pulse signals from the CPU after a predetermined time has elapsed, it determines that the CPU does not work properly and carries out a reset of the CPU or the like.

However, the above watch dog time determines that the CPU is normal when the pulse signals are input from the CPU at a constant timing. Therefore, although a timer function of the CPU can be checked, an arithmetic operation function of the CPU cannot be checked. Regarding the above problem, Japanese unexamined patent publication No. 2007-293524 discloses an inspection method for inspecting an arithmetic function of a CPU in an electronic device having a plurality of CPUs. In the electronic device disclosed in Japanese unexamined paten publication No. 2007-293524, a CPU to be inspected carries out an arithmetic operation of an arithmetic problem and sends a result of the arithmetic operation to a CPU carrying out an inspection. The CPU carrying out the inspection determines whether an arithmetic operation function of the CPU to be inspected is normal or not based on the result of the arithmetic operation received.

SUMMARY

Note that, in Japanese unexamined paten publication No. 2007-293524, the CPU to be inspected creates arithmetic problems that repeat the same contents periodically using a counter. In Japanese unexamined paten publication No. 2007-293524, answer contents (results of the arithmetic operation) are fixed and an increased value of the counter is also fixed. For this reason, when the CPU to be inspected stores the answer contents in registers beforehand, it can send answer contents readout from the registers as results of the arithmetic operation, even if it does not actually calculate the arithmetic problems. In that case, the CPU carrying out the inspection cannot determine whether the arithmetic operation function of the CPU to be inspected is normal or not.

Other problems of the related art and new features of the present disclosure will become apparent from the following descriptions of the specification and attached drawings.

According to an example aspect, an inspection system comprises a device to be inspected and an inspection device, wherein the device to be inspected acquires a constant to be used in an arithmetic operation of an arithmetic problem from the inspection device, carries out the arithmetic operation using the acquired constant while sequentially selecting a plurality of arithmetic problems, and sends a result of the arithmetic operation to the inspection device, and the inspection device determines whether an arithmetic operation unit of the device to be inspected works normally or not.

According to the above example aspect, it is possible to determine whether an arithmetic function of the device to be inspected is normal or not.

BRIEF DESCRIPTION OF THE DRAWINGS

The above and other aspects, advantages and features of the present disclosure will be more apparent from the following description of certain embodiments thereof taken in conjunction with the accompanying drawings, in which:

FIG. 9 is a diagram showing a table that can be used in a third embodiment.

FIG. 11 is a schematic diagram showing an operation example of the inspection system during a time period when a process A is carried out.

FIG. 12 is a schematic diagram showing an operation example of the inspection system during a time period when a process B is carried out.

DETAILED DESCRIPTION

Figure 1:
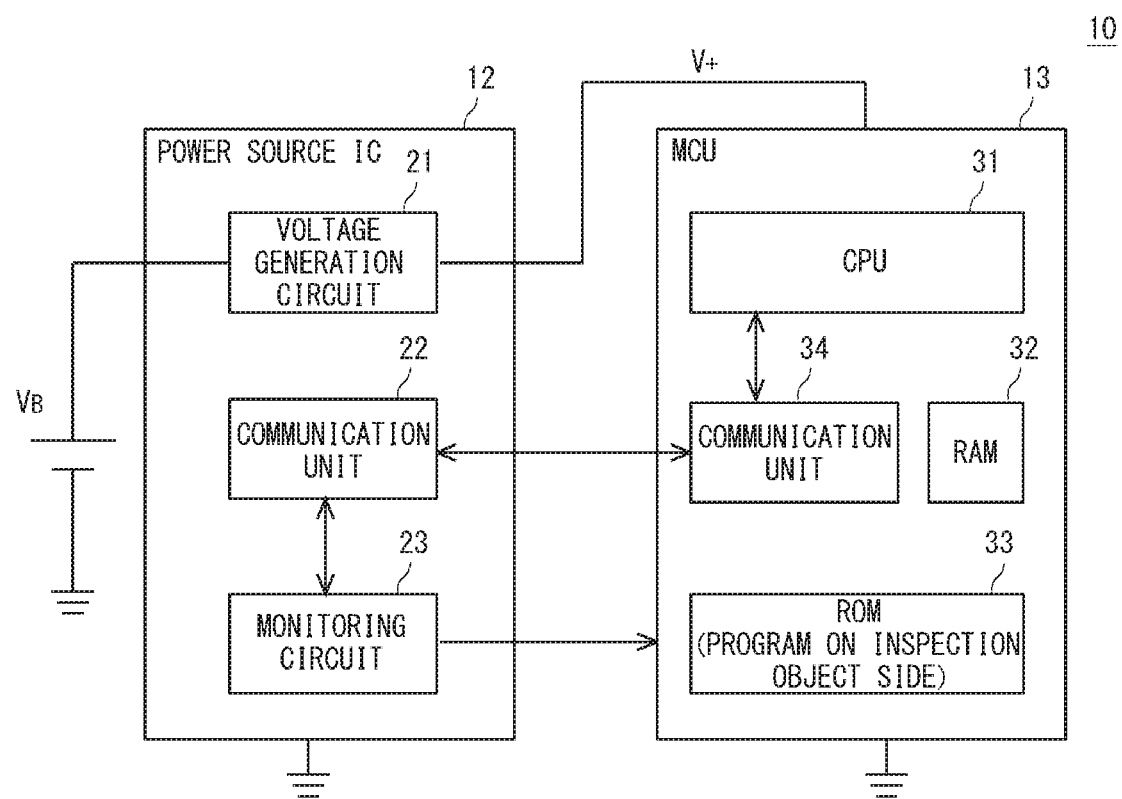
FIG. 1 is a block diagram showing an inspection system according to a first embodiment.

Hereinafter, embodiments incorporating means for solving the above-described problems will be described in detail with reference to the drawings. For the clarification of the description, some of the following description and the drawings may be omitted or simplified as appropriate. Further, each element shown in the drawings as functional blocks that perform various kinds of processing can be formed of a CPU (Central Processing Unit), a memory, and other circuits in hardware and may be implemented by programs loaded in the memory in software. Those skilled in the art will therefore understand that these functional blocks may be implemented in various ways by only hardware, only software, or a combination thereof without any limitation. Throughout the drawings, the same components are denoted by the same reference symbols and overlapping descriptions will be omitted as appropriate.

The above program can be stored and provided to a computer using any type of non-transitory computer readable medium. Non-transitory computer readable medium include any type of tangible storage medium. Examples of non-transitory computer readable medium include magnetic storage medium (such as floppy disks, magnetic tapes, hard disk drives, etc.), optical magnetic storage medium (e.g. magneto-optical disks), CD-ROM (compact disc read only memory), CD-R (compact disc recordable), CD-R/W (compact disc rewritable), and semiconductor memories (such as mask ROM, PROM (programmable ROM), EPROM (erasable PROM), flash ROM, RAM (random access memory), etc.). The program may be provided to a computer using any type of transitory computer readable medium. Examples of transitory computer readable medium include electric signals, optical signals, and electromagnetic waves. Transitory computer readable medium can provide the program to a computer via a wired communication line (e.g. electric wires, and optical fibers) or a wireless communication line.

The present disclosure will be described by dividing it into a plurality of sections or embodiments whenever circumstances require it for convenience in the following embodiments. However, unless otherwise particularly specified, these sections or embodiments may be not irrelevant to one another. One section or embodiment may be related to modifications, applications, details, supplementary explanations, and the like of some or all of the other ones. When reference is made to the number of elements or the like (including the number of pieces, numerical values, quantity, range, etc.) in the following embodiments, the number thereof is not limited to a specific number and may be greater than or less than or equal to the specific number unless otherwise particularly specified and definitely limited to the specific number in principle.

Further, in the following embodiments, components (including operation steps, etc.) are not always essential unless otherwise particularly specified and considered to be definitely essential in principle. Similarly, when reference is made to the shapes, positional relations, or the like of the components or the like in the following embodiments, they will include ones, for example, substantially approximate or similar in their shapes or the like unless otherwise particularly specified and considered not to be definitely so in principle. This is similarly applicable even to the above-described number or the like (including the number of pieces, numerical values, quantity, range, etc.).

[First Embodiment]

FIG. 1 shows an inspection system according to a first embodiment. An inspection system 10 comprises a power source IC (Integrated Circuit) 12 and a MCU (Micro Computer Unit) 13. The power source IC 12 and the MCU 13 are configured as a semiconductor integrated circuit (semiconductor device), and are installed in a vehicle such as an automobile. The MCU 13 has an arithmetic operation function. The MCU 13 carries out, for example, various kinds of control in a vehicle. The MCU 13 is used for, for example, ADAS (Advanced Driver Assistance System) and the like in a vehicle. In the present embodiment, the power source IC 12 functions as an inspection device for inspecting the arithmetic operation function of the MCU 13 while supplying electric power to the MCU 13.

The power source IC 12 comprises a voltage generation circuit 21, a communication unit 22, and a monitoring circuit 23. The voltage generation circuit (power source circuit) 21 generates electricity to be supply to the MCU 13. The voltage generation circuit 21 includes, for example, a DC (Direct Current)/DC converter, and converts a battery voltage $V_B$ into an operation power source voltage $V_+$ of the MCU 13. The voltage generation circuit 21 converts, for example, a battery voltage 12 V into an operation power source voltage $V_+$ such as 5V, or 3.3V. The voltage generation circuit 21 supplies the generated electric power of the voltage $V_+$ to the MCU 13.

The monitoring circuit (inspection circuit) 23 monitors whether the MCU 13 that is a device to be inspected works properly or not. For example, the monitoring circuit 23 periodically monitors the MCU 13. The monitoring circuit 23 has, for example, a watch dog timer function, and outputs a reset signal to the MCU 13 when it is determined that the MCU 13 does not work properly. The communication unit (communication circuit) 22 carries out communication with the MCU 13. The monitoring circuit 23 can send signals (data) to the MCU 13 and receive signals from the MCU 13 via the communication unit 22.

The MCU 13 comprises a CPU 31, a RAM 32, a ROM 33, and a communication unit 34. The CPU (processor) 31 is configured as a process execution unit in the MCU 13, and carries out various kinds of processes. The communication unit 32 carries out communication with the power source IC 12. The CPU 31 can send signals (data) to the power source IC 12 and receive signals from the power source IC 12 via the communication unit 34.

The RAM 32 is a volatile memory for storing various kinds of data. The ROM 33 is a non-volatile memory, for example, such as a flash memory. The ROM 33 stores programs to be executed by the CPU 31. The CPU 31 reads out the program from the ROM 33 and carries out various kinds of processes by executing the program read out. The programs stored in the ROM 33 include a program on an inspection object side for causing the MCU 13 to operate as a device to be inspected.

[MCU (Device to be inspected)]

Figure 2:
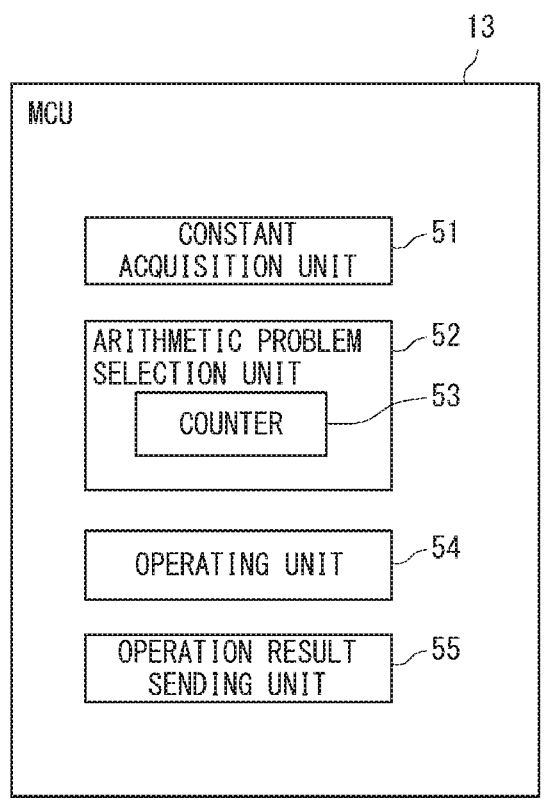
FIG. 2 is a block diagram showing elements configured in a MCU.

FIG. 2 shows elements configured in the MCU 13. The MCU 13 comprises a constant acquisition unit (constant acquisition module) 51, an arithmetic problem selection unit (arithmetic problem selection module) 52, an operation unit (operation module) 54, and an operation result sending unit (operation result sending module) 55. Each of these elements is realized, for example, in the CPU 31 operating according to the program on the inspection object side.

The arithmetic problem selection unit 52 sequentially selects a plurality of arithmetic problems. The arithmetic problem selection unit 52 includes, for example, a counter 53 and selects the arithmetic problem based on the count value of the counter 53. The counter 53 may be a counter which counts up the count value or a counter which counts down the count value. For example, to each of the plurality of the arithmetic problems, a number for uniquely identifying the arithmetic problem is assigned. The arithmetic problem selection unit 52 cases the counter 53 to operate, and sequentially selects the arithmetic problem corresponding to the count value.

The constant acquisition unit 51 acquires a constant to be used in the arithmetic operation of the arithmetic problem from the power source IC 12. The constant acquisition unit 51 acquires the constant from the power source IC 12 via the communication unit 34 (refer to FIG. 1). The constant acquisition unit 51 may acquire, for example, a plurality of constants from the power source IC 12. In the below description, an example is explained where it is assumed that the constant acquisition unit 51 acquires two values (m, n) as the constants. The arithmetic problem selection unit 52 may determine a step width when increasing or decreasing the count value of the counter 53 in accordance with a value of one of the two constants, for example a value of n. In other words, the arithmetic problem selection unit 52 may increase or decrease the count value of the counter 53 by a value corresponding to the value of n.

The operation unit 54 carries out the arithmetic operation of the arithmetic problem. The operation unit 54 carries out the arithmetic operation in accordance with the arithmetic problem selected by the arithmetic problem selection unit 52, and creates an answer. The operation unit 54 carries out the arithmetic operation using the constant acquired by the constant acquisition unit 51 in the arithmetic operation of the arithmetic problem. The operation unit 54 carries out the arithmetic operation by software processing using, for example, an ALU (Arithmetic Logic Unit) and registers provided in the CPU 31. The CPU 31 functions as the operation unit 54, for example, while carrying out a predetermined process such as controlling of the vehicle. If the operation unit 54 cannot create a correct answer with respect to the arithmetic problem, it can be determined that the arithmetic operation function does not properly work in the predetermined process carried out by the CPU 31.

The operation result sending unit 55 sends the answer (result of the arithmetic operation) created by the operation unit 54 with respect to the arithmetic problem to the power source IC 12. The arithmetic problem selection unit 52 periodically selects the arithmetic problem, for example, at a predetermined time interval, and the operation unit 54 creates the answer with respect to the arithmetic problem each time the arithmetic problem is selected. The operation result sending unit 55 sends the periodically created answer to the power source IC 12 via the communication unit 34.

[Monitoring Circuit]

Figures 3, 4:
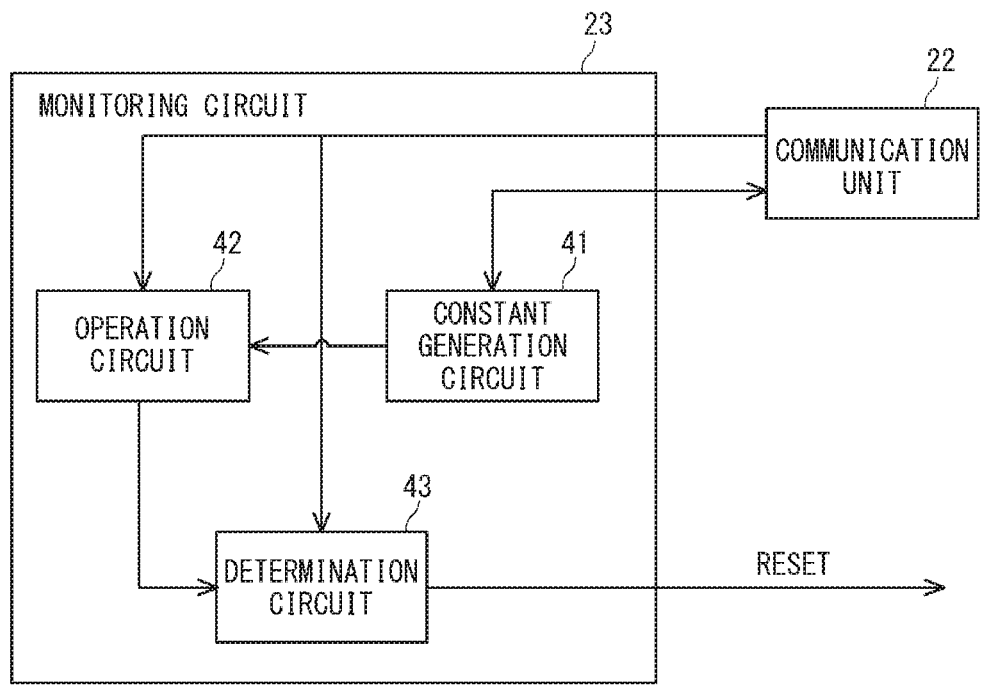
FIG. 3 is a block diagram showing a configuration of a monitoring circuit.
FIG. 4 is diagram showing an example of arithmetic problems.

FIG. 3 shows a configuration of the monitoring circuit 23. The monitoring circuit 23 comprises a constant generation circuit 41, an operation circuit 42, and a determination circuit 43. Each element in the monitoring circuit 23 is configured, for example, using a hardware circuit in the semiconductor device.

The constant generation circuit (constant sending module) 41 generates the constant to be sent to the MCU 13. The constant generation circuit 41 sends the generated constant to the MCU 13 via the communication unit 22. The constant generation circuit 41 includes, for example, a random number generation circuit (random number generator). The constant generation circuit 41 sends, to the MCU 13, a random number generated by using the random number generation circuit as the constant to be used in the arithmetic operation of the arithmetic problem.

The operation circuit 42 carries out the arithmetic operation which is the same as the arithmetic problem carried out by the MCU 13. The operation circuit 42 includes operators to be used in the arithmetic operation included in the arithmetic problem. By applying the constant sent to the MCU 13 from the constant generation circuit 41 to the operators, the arithmetic operation of the arithmetic problem is carried out in the monitoring circuit 23.

The determination circuit (determination module) 43 determines whether the arithmetic function of the MCU 13 works properly or not. The determination circuit 43 receives the answer (result of the arithmetic operation) with respect to the arithmetic problem from the MCU 13 via the communication unit 22. In addition, the determination circuit 43 acquires, from the operation circuit 42, the result acquired by carrying out the arithmetic operation of the arithmetic problem. The determination circuit 43 compares the results each other and determines whether the arithmetic operation function of the MCU 13 works properly or not based on the comparison result. The determination circuit 43 determines that the arithmetic operation function properly works if the results are matched. The determination circuit 43 determines that the arithmetic operation function does not properly work if the results are not matched. When the determination circuit 43 determines that the arithmetic operation function of the MCU 13 does not properly work, it outputs, for example, a reset signal to the MCU 13 to reset the MCU 13.

[Arithmetic Problem]

FIG. 4 shows an example of the arithmetic problems. In FIG. 4, eight arithmetic problems No. 0 to No. 7 are shown. For example, the counter 53 (refer to FIG. 2) is configured as a 3 bit counter, and the arithmetic problem selection unit 52 selects the arithmetic problem having a number which matches the count value. For example, when the count value is '3', the arithmetic problem selection unit 52 selects the arithmetic problem [n/m] of No. 3. The operation unit 54 substitutes the constants acquired by the constant acquisition unit 51 for 'm' and 'n' of the arithmetic problem to create the answer with respect to the arithmetic problem selected.

[Operation Procedure]

Figure 5:
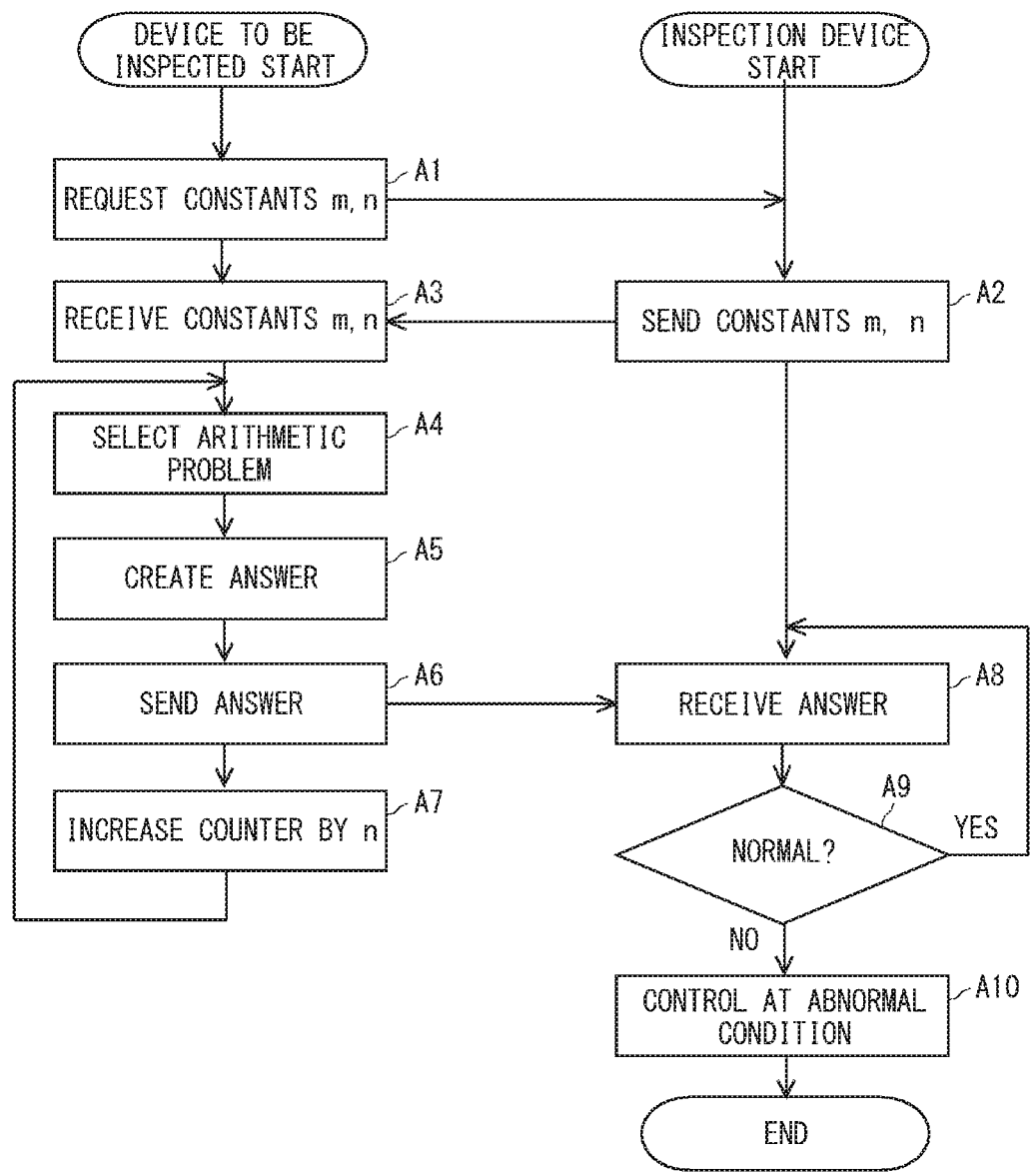
FIG. 5 is a flow chart showing an operation procedure of the inspection system.

FIG. 5 shows an operation procedure of the inspection system 10. The constant acquisition unit 51 (refer to FIG. 2) of the MCU 13 that is a device to be inspected requests, via the communication unit 34 and communication unit 22 (refer to FIG. 1), the constant from the constant generation circuit 41 (refer to FIG. 3) of the power source IC 12 that is an inspection device (Step A1). The constant generation circuit 41, for example, causes the random number generation circuit to generate two constants and sends the two constants generated as constants m, n to the constant acquisition unit 51 (Step A2). The constant acquisition unit 51 receives the constants m, n (Step A3). Note that it is assumed that m is not equal to 0. Further, it is assumed that n is greater than 0.

The constants m, n acquired by the constant acquisition unit 51 is to be used in arithmetic operation of the arithmetic problem. In addition, the constant n is also to be used, for example, as an increasing value when increasing the counter 53. Alternative to using the constant n as the increasing value of the counter 53, another constant defining the increasing value of the counter 53 may be sent form the power source IC 12 to the MCU 13. When the constant n is used for both the arithmetic operation of the arithmetic problem and the increasing value of the counter 53, it is possible to obtain an advantageous effect that an amount of information sent from the power source IC 12 to the MCU 13 can be reduced.

The arithmetic problem selection unit 52 selects (creates) the arithmetic problem (Step A4). At Step A4, the arithmetic problem selection unit 52 selects the arithmetic problem [m*n] (refer to FIG. 4) of No. 0 when the initial value of the counter is '0'. The operation unit 54 acquires the constants m, n from the constant acquisition unit 51 and acquires the selected arithmetic problem from the arithmetic problem selection unit 52. The operation unit 54 carries out the arithmetic operation of the arithmetic problem by applying the constants m, n to the arithmetic problem selected, and creates the answer with respect to the arithmetic problem (Step A5). The operation result sending unit 55 sends the answer created at Step A5 to the determination circuit 43 via the communication unit 34 and the communication unit 22 (Step A6).

The arithmetic problem selection unit 52 causes the count value of the counter 53 to increase by n after the answer with respect to the arithmetic problem is created (Step A7). For example, when the constant n equals to 2, the arithmetic problem selection unit 52 causes the count value of the counter 53 to increase by 2 from '0' to '2'. Thereafter, the process returns to Step A4, and the arithmetic problem selection unit 52 selects, at Step A4, the arithmetic problem, the number of which corresponds to the count value. By repeatedly carrying out the selection of the arithmetic problem while increasing the count value of the counter 53 by n, the MCU 13 periodically creates the answer with respect to the arithmetic problem and sends the created answer to the power source IC 12.

The determination circuit 43 receives the answer from the MCU 13 (Step A8). The operation circuit 42 carries out the arithmetic operation of the arithmetic problem selected at Step A4 using the constants m, n sent at Step A2, before the answer is received from the MCU 13 or after the answer is received therefrom. Since it is uniquely determined as to which arithmetic problem is to be selected in the MCU 13 depending on the initial value of the counter 53 and the constant n, the power source IC 12 can recognize which arithmetic problem is to be selected in the MCU 13. In other words, the power source IC 12 can recognize which arithmetic problem the answer received at Step is created from. The MCU 13 (the operation result sending unit 55) may include, in the answer to be sent, information indicating which arithmetic problem the answer is created from.

The determination circuit 43 compares the answer received from the MCU 13 with the result of the arithmetic operation of the operation circuit 42 to determine whether the arithmetic operation function of the MCU is normal or not (Step A9). When it is determined that the arithmetic operation function of the MCU 13 is normal at Step A9, the process returns to Step A8, and the determination circuit 43 waits until the next answer is received.

When the determination circuit 43 determines that the arithmetic operation function of the MCU 13 is not normal at Step A9, it carries out controlling at an abnormal condition (Step A10). The determination circuit 43 sends a reset signal to the MCU 13 to reset the MCU 13 at Step A10. The determination circuit 43 may inform the occupant of the vehicle or the like that an error has occurred using a not shown notification means such as a lamp or a buzzer.

[Operation Example]

Figure 6:
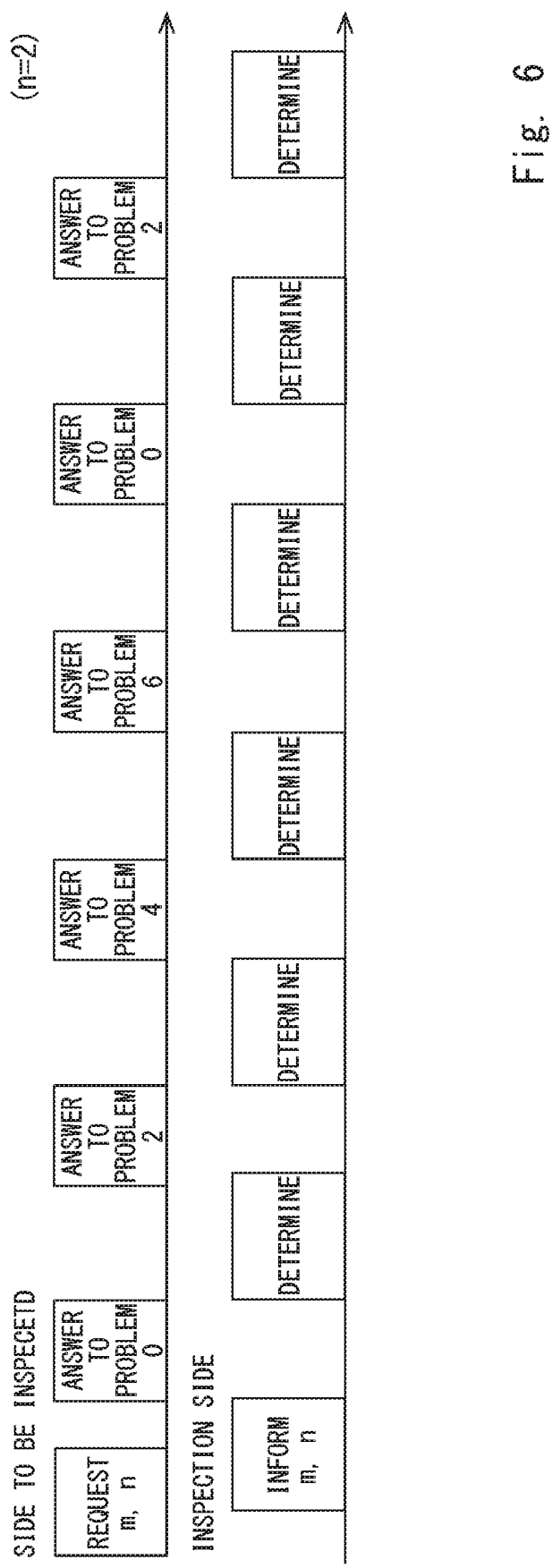
FIG. 6 is a schematic diagram showing an operation example of the inspection system.

Next, the operation in the present embodiment is explained using an operation example. FIG. 6 shows an operation example of the inspection system. Beforehand an inspection, the MCU 13 that is a device to be inspected requests the constants m, n from the power source IC 12 that is an inspection device. The power source IC 12 determines values of the constants m, n and informs the MCU 13 of the values. It is assumed that n equals to 2. In the first inspection, the MCU 13 selects the arithmetic problem No. 0 and creates an answer with respect to the arithmetic problem No. 0 using the constants m, n. The power source IC 12 carries out the arithmetic operation of the arithmetic problem No. 0 for the constants m, n using the operation circuit 42. The power source IC 12 compares the answer received from the MCU 13 with the result of the arithmetic operation of the operation circuit 42, and determines whether the arithmetic operation function of the MCU 13 is normal or not.

In the MCU 13, the arithmetic problem selection unit 52 selects the arithmetic problem No. 2 next, when n equals to 2. In the second inspection, the MCU 13 creates an answer with respect to the arithmetic problem No. 2 using the constants m, n. The power source IC 12 carries out the arithmetic operation of the arithmetic problem No. 2 for the constants m, n using the operation circuit 42. The power source IC 12 compares the answer received from the MCU 13 with the result of the arithmetic operation of the operation circuit 42, and determines whether the arithmetic operation function of the MCU 13 is normal or not.

Similarly, the MCU 13 sends the answer with respect to the arithmetic problem to the power source IC 12 while changing the number of the arithmetic problem to be selected by two. The power source IC 12 determines whether the arithmetic operation function of the MCU 13 is normal or not each time the answer is received from the MCU 13. When the next answer is not received by the power source IC 12 after a predetermined time has elapsed from the time when the previous answer is received, the power source IC 12 may determine the operation of the MCU 13 is not normal and reset the MCU 13. The MCU 13 may restore the counter 53 to the initial state when the counter 53 overflows, and select the arithmetic problem from No. 0.

The MCU 13 may request the power source IC 12 to send new constants at any timing. When sending new constants is requested for, the power source IC 12 determines values of the new constants and informs the determined values to the MCU 13. When the new constants are received, the MCU 13 creates an answer with respect to the arithmetic problem using the newly received constants, and sends the answer to the power source IC 12.

[Summary]

In the present embodiment, the MCU 13 receives a constant from the power source IC 12. The MCU 13 uses the constant received from the power source IC 12 as a variable in the creation of the answer with respect to the arithmetic problem. Further, the MCU 13 increases the count value of the counter 53 by increasing width corresponding to the constant received from the power source IC 12. In this case, in order to create a correct answer with respect to the arithmetic problem sequentially selected, the MCU 13 is required to carry out the arithmetic operation each time the answer is created. Accordingly, it is possible for the power source IC 12 to determine whether the arithmetic operation function of the MCU 13 is normal or not.

Furthermore, in the present embodiment, after the constant is informed to the MCU 13 at the first communication, the MCU 13 may send only the answer with respect to the arithmetic problem to the power source IC 12. In general Q (Question) & A (Answer) system, it is necessary to inform the arithmetic problem (its variable) every time from an inspection side to a side to be inspected. In contrast, in the present embodiment, since the constant is required to be sent only once with respect to the multiple answers of the arithmetic problems, it is possible to determine whether the arithmetic operation function of the MCU 13 is normal or not while suppressing a communication load.

[Second Embodiment]

Next, a second embodiment is explained. A configuration of an inspection system according to the present embodiment may be the same as that of the inspection system 10 shown in FIG. 1. In the present embodiment, the power source IC 12 informs the MCU 13 of a number of times the selection of the arithmetic problem is repeated. The constant acquisition unit 51 (refer to FIG. 2) of the MCU 13 sends a request to the power source IC 12 requesting acquisition of a new constant when the arithmetic problem selection unit 52 repeatedly selects the arithmetic problem for the number of times which the power source IC 12 has informed the MCU 13 about.

In addition, in the present embodiment, the power source IC 12 sends information indicating a direction of an increase or a decrease of the count value of the counter 53 to the MCU 13. In the MCU 13, the arithmetic problem selection unit 52 increases or decreases the count value of the counter 53 in accordance with the information indicating the direction of the increase or the decrease received from the power source IC 12, and selects the arithmetic problem. Points other than the above points may be the same as in the first embodiment.

[Operation Procedure]

Figure 7:
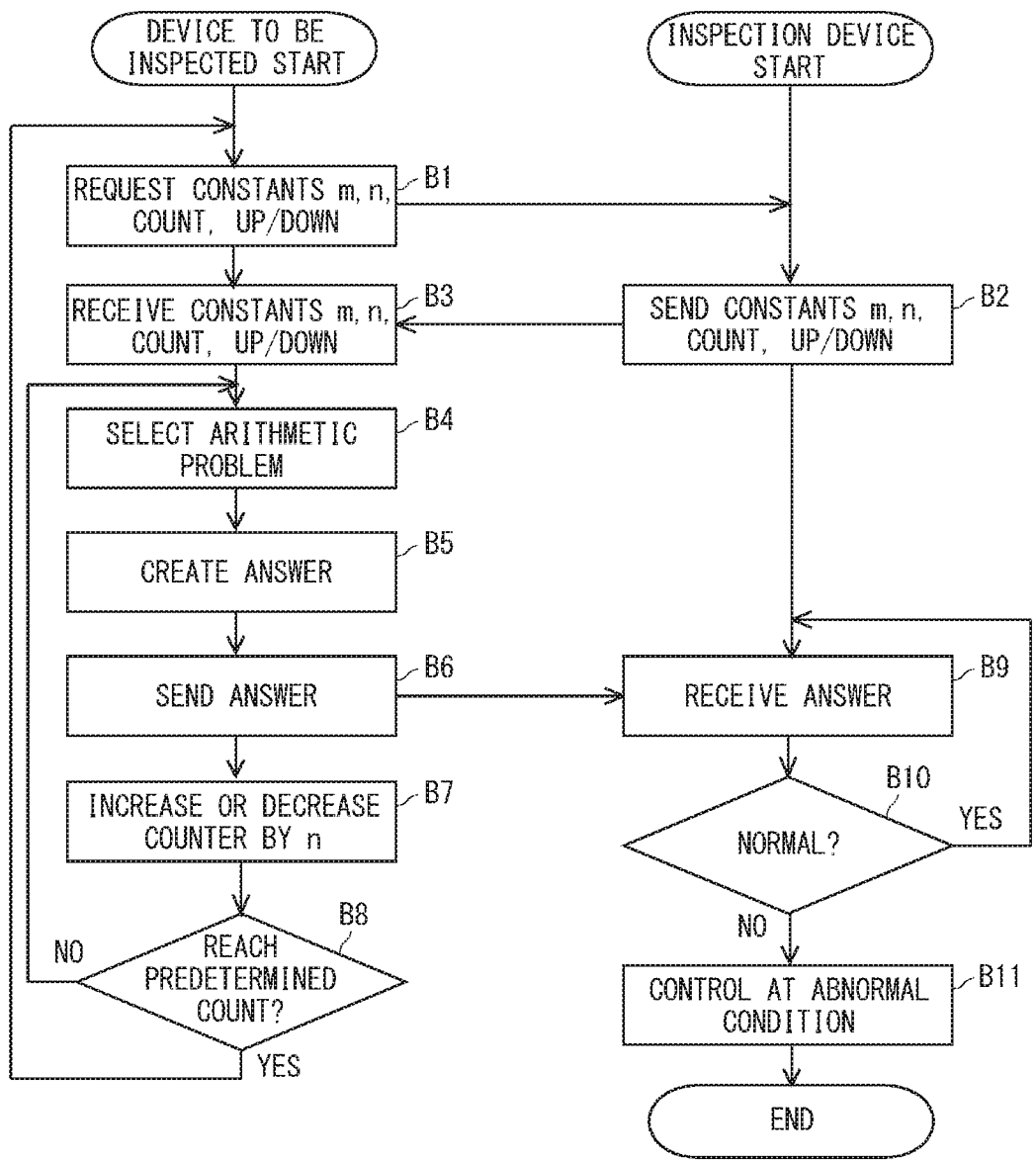
FIG. 7 is a flow chart showing an operation procedure of an inspection system according to a second embodiment.

FIG. 7 shows an operation procedure of the inspection system 10 according to the second embodiment. The constant acquisition unit 51 (refer to FIG. 2) of the MCU 13 that is a device to be inspected requests, via the communication unit 34 and the communication unit 22 (refer to FIG. 1), the constant, the repeat count, and the direction of up/down of the counter from the constant generation unit 41 (refer to FIG. 3) of the power source IC 12 that is an inspection device (Step B1). For example, the constant generation circuit 41 causes the random number generation circuit to generate two random numbers. Further the constant generation circuit 41 determines the repeat count and determines whether to count up or count down the counter 53. The constant generation circuit 41 sends the generated two random numbers as the constants m, n to the constant acquisition unit 51 (Step B2). In addition, the constant generation circuit 41 sends (informs) the repeat count, and the direction of up/down of the counter 53 to the constant acquisition unit 51.

The constant acquisition unit 51 receives the constants m, n, the repeat count, and the information indicating the direction of up/down of the counter 53 (Step B3). Even in the present embodiment, the constants m, n acquired by the constant acquisition unit 51 are used for the arithmetic operation of the arithmetic problem, and the constant n is used for the changing width of the count value of the counter 53. The information indicating the direction of up/down of the counter 53 is, for example, configured as a flag, whether the counter 53 counts up or counts down is designated depending on whether the flag is set or not.

The arithmetic problem selection unit 52 selects (creates) the arithmetic problem (Step B4). The operation unit 54 acquires the constants m, n from the constant acquisition unit 51 and acquires the selected arithmetic problem from the arithmetic problem selection unit 52. The operation unit 54 carries out the arithmetic operation of the arithmetic problem by applying the constants m, n to the selected arithmetic problem to create the answer with respect to the arithmetic problem (Step B5). The operation result sending unit 55 sends the answer created at Step B5 to the determination circuit 43 via the communication unit 34 and the communication unit 22 (Step B6). Note that Step B4 to Step B6 may be the same as Step A4 to Step A6 of FIG. 5.

The arithmetic problem selection unit 52 causes the count value of the counter 53 to increase or decrease by n after the answer with respect to the arithmetic problem is created (Step B7). For example, when the n equals to 2 and the above mentioned direction of up/down indicates plus (counting up), the arithmetic problem selection unit 52 causes the count value of the counter 53 to increase from, for example, an initial value '0' to '2'. On the other hand, when n equals to 2 and the above mentioned direction of up/down indicates minus (counting down), the arithmetic problem selection unit 52 causes the count value of the counter 53 to decrease from, for example, an initial value '7' to '5'. In the present embodiment, the power source IC 12 can control the operation direction of the counter 53 in addition to controlling the changing width of the count value of the counter 53. In this way, it is possible to make the control of the selection order of the arithmetic problem more complicated than in the first embodiment.

The arithmetic problem selection unit 52 determines whether the repeat count of the selection of the arithmetic problem reaches the repeat count received at Step B3 (Step B8). The arithmetic problem selection unit 52 increases the repeat count of the selection of the arithmetic problem by one, for example, when the counter 53 overflows or the count value of the counter 53 becomes 0 or less. When it is determined that the repeat count does not reaches a predetermined count at Step B8, the arithmetic problem selection unit 52 returns to Step B4 and selects the arithmetic problem of the number corresponding to the count value increased or decreased by n.

When it is determined that the repeat count of the selection of the arithmetic problem reaches a predetermined count at Step B8, the process return to Step B1, and the constant acquisition unit 51 requests a new constant, a repeat count, and a direction of up/down of the counter. Thereafter, the selection of the arithmetic problem and the arithmetic operation of the arithmetic problem are carried out by the newly acquired constant, repeat count, and direction of up/down of counter.

The determination circuit 43 receives the answer from the MCU 13 (Step B9). The operation circuit 42 carries out the arithmetic operation of the arithmetic problem selected at Step B4 using the constants m, n sent at Step B2, before the answer is received from the MCU 13 or after the answer is received. The determination circuit 43 compares the answer received from the MCU 13 with the result of the arithmetic operation of the operation circuit 42 to determine whether the arithmetic operation function of the MCU 13 is normal or not (Step B10). When it is determined that the arithmetic operation function of the MCU 13 is normal at Step B10, the process returns to Step B9, and the determination circuit 43 waits until the next answer is received. When the determination circuit 43 determines that the arithmetic operation function of the MCU 13 is not normal at Step B10, it carries out controlling at an abnormal condition (Step B11). Note that Step B9 to Step B11 may be the same as Step A8 to Step A10 of FIG. 5.

[Operation Example]

Figure 8:
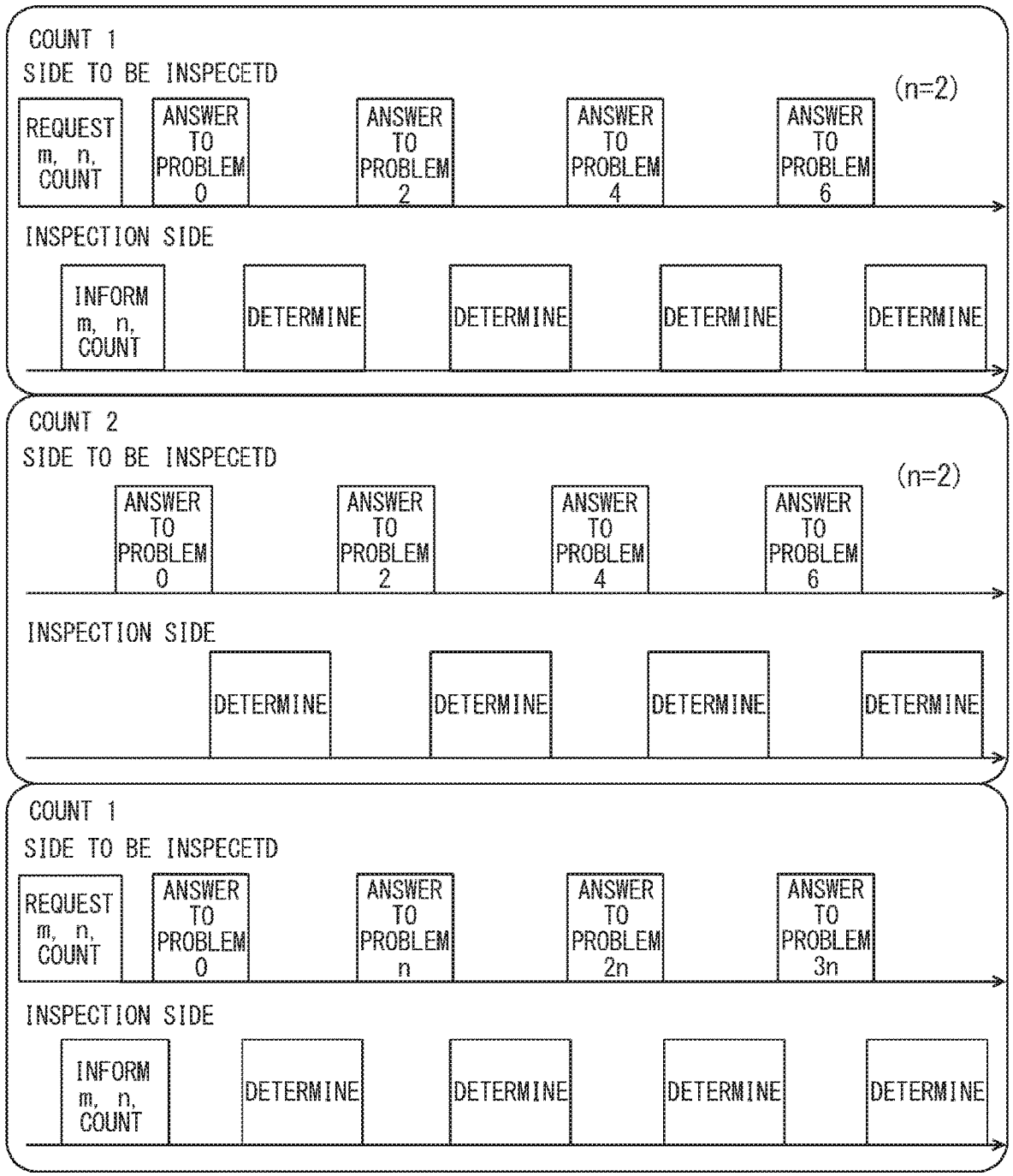
FIG. 8 is a schematic diagram showing an operation example of the inspection system according to the second embodiment.

Next, the operation in the present embodiment is explained using an operation example. FIG. 8 shows an operation example of the inspection system 10. Beforehand an inspection, the MCU 13 that is a device to be inspected requests the constants m, n, the repeat count, and the direction of up/down of the counter 53 from the power source IC 12 that is an inspection device. The power source IC 12 determines values of the constants m, n, the repeat count, and the direction of up/down of the counter 53 and informs the MCU 13 of these. It is assumed that the value of n is '2', the repeat count is 2, and the direction of up/down is plus.

In the first inspection of the repeat count '1', the MCU 13 selects the arithmetic problem No. 0 and creates an answer with respect to the arithmetic problem No. 0 using the constants m, n. The power source IC 12 carries out the arithmetic operation of the arithmetic problem No. 0 for the constants m, n using the operation circuit 42. The power source IC 12 compares the answer received from the MCU 13 with the result of the arithmetic operation of the operation circuit 42, and determines whether the arithmetic operation function of the MCU 13 is normal or not.

Next, the arithmetic problem selection unit 52 selects the arithmetic problem No. 2, and the MCU 13 creates an answer with respect to the arithmetic problem No. 2. The power source IC 12 compares the answer received from the MCU 13 with the result of the arithmetic operation of the operation circuit 42, and determines whether the arithmetic operation function of the MCU 13 is normal or not. Similarly, the MCU 13 creates answers with respect to the arithmetic problems No. 4 and No. 6, and the power source IC 12 determines whether the arithmetic operation function of the MCU 13 is normal or not After the arithmetic problem No. 6 is selected, the counter 53 overflows when the counter 53 counts up by two. In this case, the arithmetic problem selection unit 52 determines that the repeat count '1' is completed. Even in the repeat count '2', the arithmetic problem selection unit 52 sequentially selects the arithmetic problems No. 0, No. 2, No. 4, and No. 6 similar to the repeat count '1', and the MCU 13 sends answers with respect to the selected arithmetic problems to the power source IC 12. The power source IC 12 determines whether the arithmetic operation function of the MCU 13 is normal or not based on the answers received. It should be noted that the MUC 13 does not receive a new constant and the like from the power source IC 12 in the repeat count '2'. The arithmetic problem selection unit 52 selects the arithmetic problem while using the same constants m, n as in the repeat count '1', and causing the counter 53 to operate by the same increasing width In the repeat count '2', after the arithmetic problem No. 6 is selected, the counter 53 overflows when the counter 53 counts up by two. In this case, the arithmetic problem selection unit 52 determines that the repeat count reaches the predetermined count. If this is the case, the MCU 13 requests new constants m, n, a repeat count, and a direction of up/down of the counter from the power source IC 12. The power source IC 12 determines the constants m, n, the repeat count, and the direction of up/down of the counter 53 again, and inform the MCU 13 of these. The arithmetic problem selection unit 52 selects the arithmetic problem while using the new constants m, n, and causing the counter 53 to operate by the new increasing width and the direction of up/down.

For example, the arithmetic problem selection unit 52 sequentially selects the arithmetic problems No. 0, No. n, No. 2n, and No. 3n. The MCU 13 sends the answers with respect to the selected arithmetic problems to the power source IC 12. The power source IC 12 determines the arithmetic operation function of the MCU 13 is normal or not based on the answer received. When the repeat count of the arithmetic problem reaches the informed count, the MCU 13 requests new constants m, n, a repeat count, and a direction of up/down of the counter from the power source IC 12.

[Summary]

In the present embodiment, the MCU 13 acquires the constants m, n from the power source IC 12 for every predetermined repeat count, and selects the arithmetic problem and creates the answer. In the first embodiment, since the same arithmetic operations of the arithmetic problems are repeated in the MCU 13 until a new constant is requested, when the result of the arithmetic operation is cached, there is a possibility that the result of the arithmetic operation acquired from the cache may be sent to the power source IC 12. In the present embodiment, the answer with respect to the arithmetic problem is changed since a new constant and the like are acquired after a predetermined repeat count. In this case, as the MCU 13 is required to carry out the arithmetic operation in order to create the answer with respect to the arithmetic problem, it is possible to improve the inspection accuracy of the arithmetic operation function of the MCU 13.

Further, in the present embodiment, the power source IC 12 informs the MCU 13 of the repeat count. In this case, the power source IC 12 can control the inspection accuracy of the arithmetic operation function by changing the repeat count. For example, when the power source IC 12 sets the repeat count to a small number, the MCU 13 frequently requests a new constant. By carrying out the arithmetic operation of the arithmetic problem using the frequently changed constant in the MCU 13, it is possible to inspect the arithmetic operation function of the MCU 13 with high inspection accuracy. On the other hand, when the inspection accuracy of the arithmetic operation function may be relatively low, the power source IC 12 sets the repeat count to a large number. In this case, the frequency at which the MCU 13 requests a new constant from the power source IC becomes low, and the communication between the power source IC 12 and the MCU 13 is suppressed. For example, the power source IC 12 can change the acquisition frequency of the constant according to the processing condition of the other process carried out by the MCU 13, and it is possible to carry out the inspection of the arithmetic operation function of the MCU 13 with accuracy according to the processing condition.

[Third Embodiment]

Further, a third embodiment is explained. A configuration of an inspection system according to the present embodiment may be the same as that of the inspection system 10 shown in FIG. 1. In the present embodiment, the arithmetic problem selection unit 52 (refer to FIG. 2) determines arithmetic problems to be selected in the selection of the arithmetic problem in accordance with a process to be carried out by the CPU 31. Points other than the above point may be the same as in the first embodiment or the second embodiment.

For example, in a period during which a certain process is being carried out by the CPU 31, it may be important for specific types of the arithmetic operation to be correctly carried out. In addition, in a period during which another process is being carried out by the CPU 31, there are cases where it is important for other specific types of the arithmetic operation to be correctly carried out. The present embodiment allows the arithmetic problem selection unit 52 to change the arithmetic problems to be selected according to the process to be executed by the CPU 31. By doing so, for example, when a certain process is being carried out by the CPU 31, it is possible to inspect whether arithmetic operations important for the process can be correctly carried out or not.

[Table]

FIG. 9 shows a table that can be used for determining the arithmetic problems to be selected in the present embodiment. The MCU 13 stores, for example in the ROM 33, a table associating a process to be carried out by the processor and arithmetic problems to be selected by the arithmetic problem selection unit 52 when the process is carried out. Here, it is assumed that a universal set of the arithmetic problems includes eight arithmetic problems No. 0 to No. 7 shown in FIG. 4.

In FIG. 9, the process A and No. 0, No. 1, and No. 3 are stored in the table in association with each other. Further, the process B and No. 1, No. 2, No. 3, and No. 5 are stored in the table in association with each other. In this case, the arithmetic problem selection unit 52 sequentially selects the arithmetic problems No. 0, No. 1, and No. 3 when the process A is being carried out by the CPU 31, and cause the operation unit 54 to carry out the arithmetic operation of these arithmetic problems. Further, the arithmetic problem selection unit 52 sequentially selects the arithmetic problems No. 1, No. 2, No. 4, and No. 5 when the process B is being carried out by the CPU 31, and cause the operation unit 54 to carry out the arithmetic operation of these arithmetic problems. When the CPU 31 is carrying out a process not stored in the table, the arithmetic problem selection unit 52 may select the arithmetic problem from among eight arithmetic problems shown in FIG. 4. in the same manner as described in the first embodiment or the second embodiment.

[Operation procedure]

Figure 10:
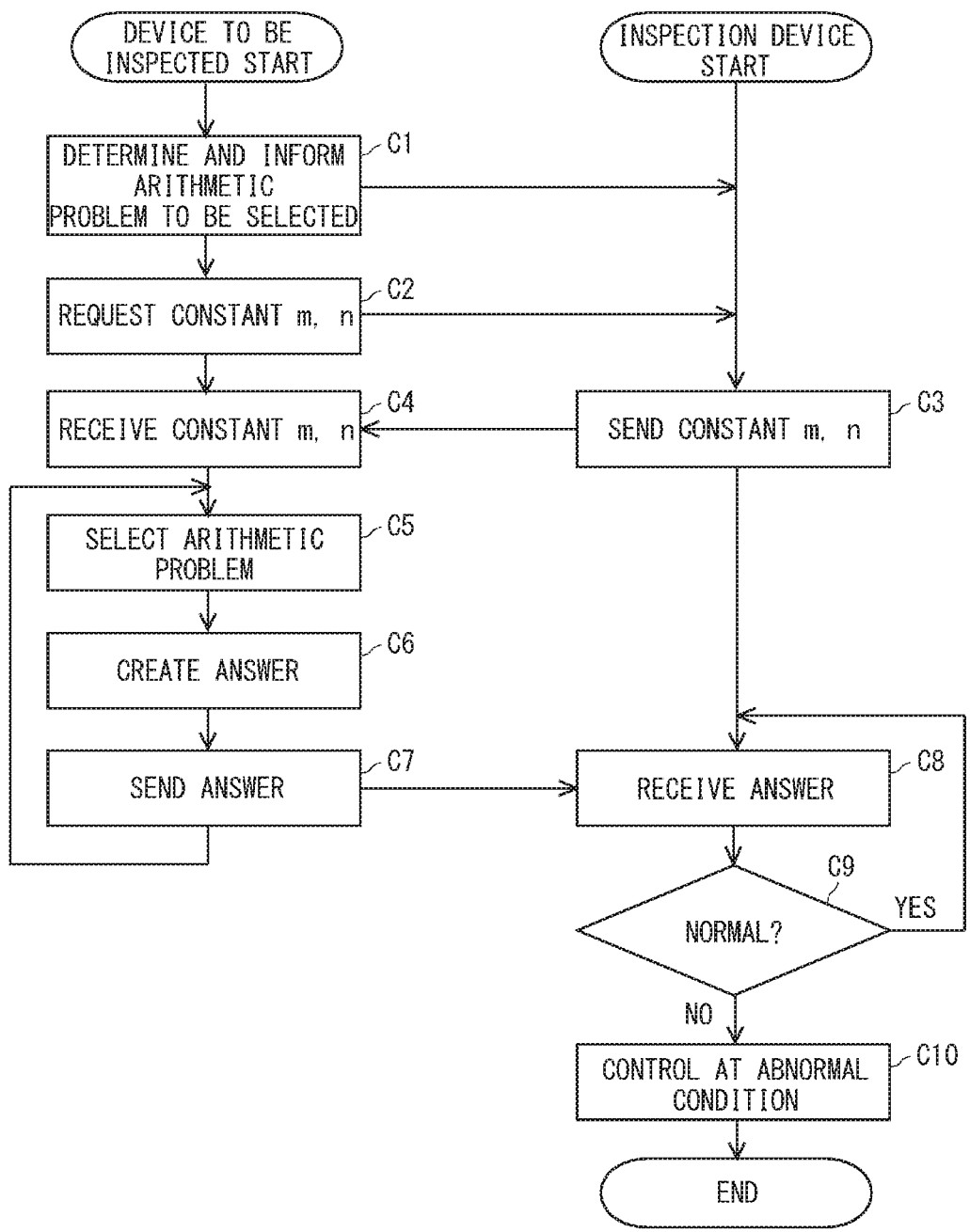
FIG. 10 is a flow chart showing an operation procedure of an inspection system according to the third embodiment.

FIG. 10 shows an operation procedure of the inspection system 10 according to the present embodiment. The arithmetic problem selection unit 52 of the MCU 13 that is a device to be inspected determines the arithmetic problems to be selected according to the process carried out by the CPU 31 (refer to FIG. 1) (Step C1). At Step C1, for example, the arithmetic problem selection unit 52 determines the arithmetic problems to be selected based on the process already carried out or to be carried out by the CPU 31 and the above described table. Specifically, for example, the arithmetic problem selection unit 52 identifies the process carried out by the CPU 31, refers to the table shown in FIG. 9, and determines the arithmetic problems whose numbers are stored in association with the process carried out as the arithmetic problems to be selected.

The arithmetic problem selection unit 52 sends (informs) information for identifying the arithmetic problems to be selected determined at Step C1 to the power source IC 12 that is an inspection device. For example, when the process A is carried out, the arithmetic problems selection unit 52 informs the power source IC 12 that the arithmetic problems No. 0, No. 1, and No. 3 are to be selected in the selection of the arithmetic problem. The arithmetic problem selection unit 52 may send, for example, data in which a predetermined value is set in bits corresponding to the numbers of the arithmetic problems determined as the subjects for the selection as the information for identifying the arithmetic problems to be selected. Specifically, when there are eight arithmetic problems in total, each bit of 8 bit data may be associated with No. 0 to No. 7, and data in which the value '1' is set in the bit corresponding to the number of the arithmetic problem determined as the subject for the selection may be sent as the information for indentifying the arithmetic problems to be selected.

The constant acquisition unit 51 of the MCU 13 requests, via the communication unit 34 and the communication unit 22 (refer to FIG. 1), the constant from the constant generation unit 41 (refer to FIG. 3) of the power source IC 12 (Step C2). For example, the constant generation circuit 41 causes the random number generation circuit to generate two random numbers and sends the generated two random numbers as the constants m, n to the constant acquisition unit 51 (Step C3). The constant acquisition unit 51 receives the constants m, n (Step C4). Note that Step C2 to Step C4 may be the same as Step A1 to Step A3 of FIG. 5.

The arithmetic problem selection unit 52 selects (creates) the arithmetic problem (Step C5). At Step C5, the arithmetic problem selection unit 52 sequentially selects the arithmetic problem from among the arithmetic problems determined as the subjects for the selection at Step C1. The operation unit 54 acquires the constants m, n from the constant acquisition unit 51 and acquires the selected arithmetic problem from the arithmetic problem selection unit 52. The operation unit 54 carries out the arithmetic operation of the arithmetic problem by applying the constants m, n to the selected arithmetic problem to create the answer with respect to the arithmetic problem (Step C6). The operation result sending unit 55 sends the answer created at Step C6 to the determination circuit 43 via the communication unit 34 and the communication unit 22 (Step C7). Note that Step C6 and Step C7 may be the same as Step A5 and Step A6 of FIG. 5.

After the answer with respect to the arithmetic problem is created, the process return to Step C5, and the arithmetic problem selection unit 52 selects the next arithmetic problem from among the arithmetic problems determined as the subjects for the selection. At Step C5, the arithmetic problem selection unit 52 sequentially selects a not selected arithmetic problem one by one from among the arithmetic problems determined as the subjects for the selection. When there is no unselected arithmetic problem, the arithmetic problem selection unit 52 returns to an initial state and sequentially selects the arithmetic problem one by one from among the arithmetic problems determined as the subjects for the selection. The MCU 13 sequentially creates the answer with respect to the arithmetic problem and sequentially sends the created answer to the power source IC 12.

The determination circuit 43 receives the answer from the MCU 13 (Step C8). The operation circuit 42 carries out the arithmetic operation of the arithmetic problem selected at Step C5 using the constants m, n sent at Step C3, before the answer is received from the MCU 13 or after the answer is received. Since it is informed which arithmetic problems are the subjects for the selection in the MCU 13 at Step C1, the power source IC 12 can recognize which arithmetic problem the MCU 13 will select. The determination circuit 43 compares the answer received from the MCU 13 with the result of the arithmetic operation of the operation circuit 42 to determine whether the arithmetic operation function of the MCU 13 is normal or not (Step C9). When it is determined that the arithmetic operation function of the MCU 13 is normal at Step C9, the process returns to Step C8, and the determination circuit 43 waits until the next answer is received.

When the determination circuit 43 determines that the arithmetic operation function of the MCU 13 is not normal at Step C9, it carries out controlling at an abnormal condition (Step C10). The determination circuit 43 sends, at Step C10, a reset signal to the MCU 13 to reset the CPU 13. Note that Step C8 to Step C101 may be the same as Step A8 to Step A10 of FIG. 5. In the present embodiment, similar to the second embodiment, the power source IC 12 may inform the repeat count and the MCU 13 may request a new constant for each repeat count.

[Operation Example]

Next, an operation is explained using an operation example. FIG. 11 shows an operation example of the inspection system 10 during a period of time when the process A is carried out. When the process A is carried out by the CPU 31, the arithmetic problem selection unit 52 determines the arithmetic problems No. 0, No. 1, and No. 3 as the arithmetic problems to be selected referring to the table shown in FIG. 9. Beforehand an inspection, the MCU 13 that is a device to be inspected requests the constants m, n from the power source IC 12 that is an inspection device. In addition, the MCU 13 informs the power source IC 12 that the arithmetic problems No. 0, No. 1, and No. 3 are the arithmetic problems to be selected in the subsequent inspection. The power source IC 12 determines values of the constants m, n and informs the MCU 13 of the values.

In the first inspection, the MCU 13 selects the arithmetic problem No. 0 and creates an answer with respect to the arithmetic problem No. 0 using the constants m, n. The power source IC 12 carries out the arithmetic operation of the arithmetic problem No. 0 for the constants m, n using the operation circuit 42. The power source IC 12 compares the answer received from the MCU 13 with the result of the arithmetic operation of the operation circuit 42, and determines whether the arithmetic operation function of the MCU 13 is normal or not.

Next, the arithmetic problem selection unit 52 selects the arithmetic problem No. 1. In the second inspection, the MCU 13 creates an answer with respect to the arithmetic problem No. 1 using the constants m, n. The power source IC 12 carries out the arithmetic operation of the arithmetic problem No. 1 for the constants m, n using the operation circuit 42. The power source IC 12 compares the answer received from the MCU 13 with the result of the arithmetic operation of the operation circuit 42, and determines whether the arithmetic operation function of the MCU 13 is normal or not.

Further, the arithmetic problem selection unit 52 selects the arithmetic problem No. 3. In the third inspection, the MCU 13 creates an answer with respect to the arithmetic problem No. 3 using the constants m, n. The power source IC 12 carries out the arithmetic operation of the arithmetic problem No. 3 for the constants m, n using the operation circuit 42. The power source IC 12 compares the answer received from the MCU 13 with the result of the arithmetic operation of the operation circuit 42, and determines whether the arithmetic operation function of the MCU 13 is normal or not.

Similarly, the arithmetic problem selection unit 52 sequentially selects the arithmetic problems No. 0, No. 1, and No. 3. The MCU 13 sends the answer with respect to the selected arithmetic problem to the power source IC 12. In the period of time when the process A is carried out, the MCU 13 repeatedly carries out the arithmetic problems No. 0, No. 1, and No. 3, which are determined as the subjects for the selection, and does not carry out the arithmetic problems of the other numbers. The power source IC 12 determines whether the arithmetic operation function of the MCU 13 is normal or not each time the answer is received from the MCU 13. The MCU 13 may request the power source IC 12 to send a new constant at any timing.

FIG. 12 shows an operation example of the inspection system 10 during a period of time when the process B is carried out. When the process B is carried out by the CPU 31, the arithmetic problem selection unit 52 determines the arithmetic problems No. 1, No. 2, No. 4, and No. 5 as the arithmetic problems to be selected referring to the table shown in FIG. 9. Beforehand an inspection, the MCU 13 that is a device to be inspected requests the constants m, n from the power source IC 12 that is an inspection device. In addition, the MCU 13 informs the power source IC 12 that the arithmetic problems No. 1, No. 2, No. 4, and No. 5 are the arithmetic problems determined as the subjects for the selection in the subsequent inspection. The power source IC 12 determines values of the constants m, n and informs the MCU 13 of the values.

In the first inspection, the MCU 13 selects the arithmetic problem No. 1 and creates an answer with respect to the arithmetic problem No. 1 using the constants m, n. The power source IC 12 carries out the arithmetic operation of the arithmetic problem No. 1 for the constants m, n using the operation circuit 42. The power source IC 12 compares the answer received from the MCU 13 with the result of the arithmetic operation of the operation circuit 42, and determines whether the arithmetic operation function of the MCU 13 is normal or not.

Next, the arithmetic problem selection unit 52 selects the arithmetic problem No. 2. In the second inspection, the MCU 13 creates an answer with respect to the arithmetic problem No. 2 using the constants m, n. The power source IC 12 carries out the arithmetic operation of the arithmetic problem No. 2 for the constants m, n using the operation circuit 42. The power source IC 12 compares the answer received from the MCU 13 with the result of the arithmetic operation of the operation circuit 42, and determines whether the arithmetic operation function of the MCU 13 is normal or not.

Further, the arithmetic problem selection unit 52 selects the arithmetic problem No. 4. In the third inspection, the MCU 13 creates an answer with respect to the arithmetic problem No. 4 using the constants m, n. The power source IC 12 carries out the arithmetic operation of the arithmetic problem No. 4 for the constants m, n using the operation circuit 42. The power source IC 12 compares the answer received from the MCU 13 with the result of the arithmetic operation of the operation circuit 42, and determines whether the arithmetic operation function of the MCU 13 is normal or not.

Furthermore, the arithmetic problem selection unit 52 selects the arithmetic problem No. 5. In the fourth inspection, the MCU 13 creates an answer with respect to the arithmetic problem No. 5 using the constants m, n. The power source IC 12 carries out the arithmetic operation of the arithmetic problem No. 5 for the constants m, n using the operation circuit 42. The power source IC 12 compares the answer received from the MCU 13 with the result of the arithmetic operation of the operation circuit 42, and determines whether the arithmetic operation function of the MCU 13 is normal or not.

Similarly, the arithmetic problem selection unit 52 sequentially selects the arithmetic problems No. 1, No. 2, No. 4, and No. 5. The MCU 13 sends the answer with respect to the selected arithmetic problem to the power source IC 12. In the period of time when the process B is carried out, the MCU 13 repeatedly carries out the arithmetic problems No. 1, No. 2, No. 4, and No. 5, which are determined as the subjects for the selection, and does not carry out the arithmetic problems of the other numbers. The power source IC 12 determines whether the arithmetic operation function of the MCU 13 is normal or not each time the answer is received from the MCU 13. The MCU 13 may request the power source IC 12 to send a new constant at any timing.

[Summary]

In the present embodiment, the arithmetic problem selection unit 52 determines the arithmetic problems to be selected as the arithmetic problems in the inspection of the arithmetic operation function of the MCU 13, according to the other process carried out by the CPU 31. For example, by determining the arithmetic problems which include the arithmetic operations important for the process carried out as the subjects for the selection, the power source IC 12 can inspect whether the MCU 13 can correctly carry out these important arithmetic operations or not. In addition, by excluding the arithmetic problems which include the arithmetic operations not necessary for the process carried out from the subjects for the selection, it is possible to exclude unnecessary arithmetic operations from the subject for the inspection, and thus it is possible to carry out an efficient inspection of the arithmetic operation function.

[Modified Example]

In the above embodiments, an example in which the power source IC 12 is an inspection device and the MCU 13 is a device to be inspected is explained. However, the present disclosure is not limited thereto. A semiconductor device in which the function of the inspection device is installed is not particularly limited, and the function of the inspection device may be installed in an IC other than the power source IC. Alternatively, the function of the inspection device is not necessary to be installed in an IC having a certain function, and the function of the inspection device itself may be formed as an IC. Further, the device to be inspected may be a device having arithmetic operation function, and is not particularly limited to the MCU.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

For example, all or some of the embodiments disclosed above can be described like in, but not limited to, the following supplementary notes.

[Supplementary Note 1]

An inspection system comprising a device to be inspected and an inspection device which can communicate with each other, wherein the device to be inspected comprises:

an arithmetic problem selection module configured to sequentially select a plurality of arithmetic problems;

a constant acquisition module configured to acquire a constant to be used in an arithmetic operation of the arithmetic problem from the inspection device;

an operation module configured to carry out the arithmetic operation using the constant in accordance with the arithmetic problem selected by the arithmetic problem selection module; and an operation result sending module configured to send a result of the arithmetic operation of the operation module to the inspection device, and the inspection device comprises:

a constant sending module configured to send the constant to the device to be inspected;

an operation circuit configured to carry out the arithmetic operation of the arithmetic problem;

a determination module configured to receive the result of the arithmetic operation from the device to be inspected, compare the result of the arithmetic operation received with a result acquired by causing the operation circuit to carry out the arithmetic operation based on the constant sent by the constant sending module, and determine whether an arithmetic operation function of the device to be inspected works properly or not based on a comparison result.

[Supplementary Note 2]

The inspection system according to Supplementary Note 1, wherein the arithmetic problem selection module comprises a counter and selects the arithmetic problem based on a count value of the counter.

[Supplementary Note 3]

The inspection system according to Supplementary Note 2, wherein the constant includes a first constant and a second constant, and the arithmetic problem selection module increases or decreases the count value by a value corresponding to a value of the second constant.

[Supplementary Note 4]

The inspection system according to Supplementary Note 2, wherein the constant sending module further sends information indicating a direction of an increase or a decrease of the count value to the device to be inspected.

[Supplementary Note 5]

The inspection system according to Supplementary Note 2, wherein the constant acquisition module acquires a new constant from the inspection device when the arithmetic problem selection module repeatedly selects the arithmetic problem for a predetermined number of times.

[Supplementary Note 6]

The inspection system according to Supplementary Note 5, wherein the arithmetic problem selection module increases a number of times that selection of the arithmetic problem is repeated by one when the counter overflows or the count value becomes 0 or less.

[Supplementary Note 7]

The inspection system according to Supplementary Note 5, wherein the inspection device informs the device to be inspected of a number of times that selection of the arithmetic problem is repeated.

[Supplementary Note 8]

The inspection system according to Supplementary Note 1, wherein the device to be inspected comprises a microprocessor unit comprising a processor.

[Supplementary Note 9]

The inspection system according to Supplementary Note 8, wherein the processor functions as the operation module while carrying a predetermined process.

[Supplementary Note 10]

10. The inspection system according to Supplementary Note 9, wherein the arithmetic problem selection module determines arithmetic problems as subjects for selection of the arithmetic problem in accordance with a process to be carried out by the processor.

[Supplementary Note 11]

The inspection system according to Supplementary Note 10, wherein the device to be inspected further comprises a table storing the process to be carried out by the processor and the arithmetic problems to be determined as the subjects for the selection in association with each other, and the arithmetic problem selection module determines the arithmetic problems as the subjects for the selection based on the process to be carried out by the processor and the table.

[Supplementary Note 12]

The inspection system according to Supplementary Note 11, wherein the device to be inspected informs the inspection device of information for identifying the arithmetic problems to be selected by the arithmetic problem selection module.

[Supplementary Note 13]

The inspection system according to Supplementary Note 12, wherein a number is assigned to each of the plurality of the arithmetic problems, and the device to be inspected sends data in which a predetermined value is set in bits corresponding to the numbers assigned to the arithmetic problems to be selected by the arithmetic problem selection module as the information for identifying the arithmetic problems to be selected by the arithmetic problem selection module.

[Supplementary Note 14]

The inspection system according to Supplementary Note 1, wherein the constant sending module comprises a random number generator, and sends a random number generated by the random number generator as the constant to the device to be inspected.

[Supplementary Note 15]

15. An inspection device comprising:

a communication circuit configured to communicate with a device to be inspected having an arithmetic operation function;

a constant sending module configured to send, to the device to be inspected, a constant to be used when an arithmetic operation is carried out by the device to be inspected in accordance with an arithmetic problem, the arithmetic problem being sequentially selected from among a plurality of arithmetic problems;

an operation circuit configured to carry out the arithmetic operation of the arithmetic problem;

a determination module configured to receive, from the device to be inspected, a result of the arithmetic operation acquired by carrying out the arithmetic operation using the constant in accordance with the arithmetic problem, compare the result of the arithmetic operation received with a result acquired by causing the operation circuit to carry out the arithmetic operation based on the constant sent by the constant sending module, and determine whether the arithmetic function of the device to be inspected works properly or not based on a comparison result.

[Supplementary Note 16]

A semiconductor device comprising:

an inspection circuit configured to inspect a device to be inspected having an arithmetic operation function;

a communication circuit configured to communicate with the device to be inspected; and a power source circuit configured to supply electricity to the device to be inspected, the inspection circuit comprises:

a constant sending module configured to send, to the device to be inspected, a constant to be used when an arithmetic operation is carried out by the device to be inspected in accordance with an arithmetic problem, the arithmetic problem being sequentially selected from among a plurality of arithmetic problems;

an operation circuit configured to carry out the arithmetic operation of the arithmetic problem;

a determination module configured to receive, from the device to be inspected, a result of the arithmetic operation acquired by carrying out the arithmetic operation using the constant in accordance with the arithmetic problem, compare the result of the arithmetic operation received with a result acquired by causing the operation circuit to carry out the arithmetic operation based on the constant sent by the constant sending module, and determine whether the arithmetic function of the device to be inspected works properly or not based on a comparison result.

[Supplementary Note 17]

A semiconductor device comprising:

a communication circuit configured to communicate with an inspection device;

an arithmetic problem selection module configured to sequentially select a plurality of arithmetic problems;

a constant acquisition module configured to acquire a constant to be used in an arithmetic operation of the arithmetic problem from the inspection device;

an operation module configured to carry out the arithmetic operation using the constant in accordance with the arithmetic problem selected by the arithmetic problem selection module; and an operation result sending module configured to send a result of the arithmetic operation of the operation module to the inspection device.

[Supplementary Note 18]

A semiconductor device comprising a processor and a memory, wherein the processor executes, by reading out and executing a program stored in the memory, steps of acquiring a constant from an inspection device which inspects operations of the processor;

selecting a plurality of arithmetic problems sequentially;

carrying out an arithmetic operation using the constant in accordance with the arithmetic problem selected, and sending a result of the arithmetic operation to the inspection device.

[Supplementary Note 19]

An inspection method of an arithmetic operation function for inspecting a device to be inspected having an arithmetic operation function comprising:

sending a constant to be used in an arithmetic operation to the device to be inspected;

receiving, from the device to be inspected, a result acquired by carrying out an arithmetic operation in accordance with an arithmetic problem sequentially selected from among a plurality of arithmetic problems using the constant;

carrying out an arithmetic operation of the arithmetic problem by an operation circuit based on the constant sent;

comparing the result received from the device to be inspected with a result of the arithmetic operation of the operation circuit; and determining whether the arithmetic operation function of the device to be inspected works properly or not based on a comparison result.

[Supplementary Note 20]

A operation method of a device to be inspected having an arithmetic operation function, comprising:

acquiring a constant from an inspection device which inspects operations of the device to be inspected;

selecting a plurality of arithmetic problems sequentially;

carrying out an arithmetic operation using the constant in accordance with the arithmetic problem selected; and sending a result of the arithmetic operation to the inspection device.

What is claimed is:

1. An inspection system comprising a device to be inspected and an inspection device which can communicate with each other, wherein the device to be inspected comprises:

an arithmetic problem selection module configured to sequentially select a plurality of arithmetic problems;

a constant acquisition module configured to acquire a constant to be used in an arithmetic operation of the arithmetic problem from the inspection device;

an operation module configured to carry out the arithmetic operation using the constant in accordance with the arithmetic problem selected by the arithmetic problem selection module; and an operation result sending module configured to send a result of the arithmetic operation of the operation module to the inspection device, the inspection device comprises:
a constant sending module configured to send the constant to the device to be inspected;
an operation circuit configured to carry out the arithmetic operation of the arithmetic problem; and
a determination module configured to receive the result of the arithmetic operation from the device to be inspected, compare the result of the arithmetic operation received with a result acquired by causing the operation circuit to carry out the arithmetic operation based on the constant sent by the constant sending module, and determine whether an arithmetic operation function of the device to be inspected works properly or not based on a comparison result,
wherein the arithmetic problem selection module comprises a counter and selects the arithmetic problem based on a count value of the counter,
wherein the constant includes a first constant and a second constant, and
wherein the arithmetic problem selection module increases or decreases the count value by a value corresponding to a value of the second constant.

2. The inspection system according to claim 1, wherein the constant sending module further sends information indicating a direction of an increase or a decrease of the count value to the device to be inspected.

3. The inspection system according to claim 1, wherein the constant acquisition module acquires a new constant from the inspection device when the arithmetic problem selection module repeatedly selects the arithmetic problem for a predetermined number of times.

4. The inspection system according to claim 3, wherein the arithmetic problem selection module increases a number of times that selection of the arithmetic problem is repeated by one when the counter overflows or the count value becomes 0 or less.

5. The inspection system according to claim 3, wherein the inspection device informs the device to be inspected of a number of times that selection of the arithmetic problem is repeated.

6. The inspection system according to claim 1, wherein the device to be inspected comprises a microprocessor unit comprising a processor.

7. The inspection system according to claim 6, wherein the processor functions as the operation module while carrying a predetermined process.

8. The inspection system according to claim 7, wherein the arithmetic problem selection module determines arithmetic problems as subjects for selection of the arithmetic problem in accordance with a process to be carried out by the processor.

9. The inspection system according to claim 8, wherein the device to be inspected further comprises a table storing the process to be carried out by the processor and the arithmetic problems to be determined as the subjects for the selection in association with each other, and
the arithmetic problem selection module determines the arithmetic problems as the subjects for the selection based on the process to be carried out by the processor and the table.

10. The inspection system according to claim 9, wherein the device to be inspected informs the inspection device of information for identifying the arithmetic problems to be selected by the arithmetic problem selection module.

11. The inspection system according to claim 10, wherein a number is assigned to each of the plurality of the arithmetic problems, and
the device to be inspected sends data in which a predetermined value is set in bits corresponding to the numbers assigned to the arithmetic problems to be selected by the arithmetic problem selection module as the information for identifying the arithmetic problems to be selected by the arithmetic problem selection module.

12. The inspection system according to claim 1, wherein the constant sending module comprises a random number generator, and sends a random number generated by the random number generator as the constant to the device to be inspected.

13. An inspection device comprising:
a communication circuit configured to communicate with a device to be inspected having an arithmetic operation function;
a constant sending module configured to send, to the device to be inspected, a constant to be used when an arithmetic operation is carried out by the device to be inspected in accordance with an arithmetic problem, the arithmetic problem being sequentially selected from among a plurality of arithmetic problems;
an operation circuit configured to carry out the arithmetic operation of the arithmetic problem; and
a determination module configured to receive, from the device to be inspected, a result of the arithmetic operation acquired by carrying out the arithmetic operation using the constant in accordance with the arithmetic problem, compare the result of the arithmetic operation received with a result acquired by causing the operation circuit to carry out the arithmetic operation based on the constant sent by the constant sending module, and determine whether the arithmetic function of the device to be inspected works properly or not based on a comparison result,
wherein the arithmetic problem is selected based on a count value of a counter of the device to be inspected,
wherein the constant includes a first constant and a second constant, and
wherein the count value by a value increases or decreases corresponding to a value of the second constant.

14. An inspection method of an arithmetic operation function for inspecting a device to be inspected having an arithmetic operation function comprising:
sending a constant to be used in an arithmetic operation to the device to be inspected;
receiving, from the device to be inspected, a result acquired by carrying out an arithmetic operation in accordance with an arithmetic problem sequentially selected from among a plurality of arithmetic problems using the constant;
carrying out an arithmetic operation of the arithmetic problem by an operation circuit based on the constant sent;
comparing the result received from the device to be inspected with a result of the arithmetic operation of the operation circuit; and
determining whether the arithmetic operation function of the device to be inspected works properly or not based on a comparison result wherein the arithmetic problem is selected based on a count value of a counter of the device to be inspected, wherein the constant includes a first constant and a second constant, and wherein the count value by a value increases or decreases corresponding to a value of the second constant.

* * * * *